United States Patent
Park et al.

(10) Patent No.: US 7,037,852 B2
(45) Date of Patent: May 2, 2006

(54) COMPOSITION FOR STRIPPING PHOTORESIST AND METHOD OF PREPARING THE SAME

(75) Inventors: Dong-jin Park, Osan-si (KR); Jin-sung Kim, Suwon-si (KR); Pil-kwon Jun, Yongin-si (KR); Jin-ho Hwang, Suwon-si (KR); Il-hyun Sohn, Suwon-si (KR)

(73) Assignee: Samsung Electronics Co., Ltd., Kyungki-Do (KR)

( * ) Notice: Subject to any disclaimer, the term of this patent is extended or adjusted under 35 U.S.C. 154(b) by 57 days.

(21) Appl. No.: 10/384,711

(22) Filed: Mar. 11, 2003

(65) Prior Publication Data
US 2004/0063595 A1 Apr. 1, 2004

(30) Foreign Application Priority Data
Sep. 26, 2002 (KR) ............ 10-2002-0058469

(51) Int. Cl.
*H01L 21/461* (2006.01)
*B08B 6/00* (2006.01)
*C09K 13/00* (2006.01)

(52) U.S. Cl. ............. 438/745; 438/749; 134/1.2; 134/1.3; 252/79.1; 252/79.4

(58) Field of Classification Search ........... 438/745, 438/749; 134/1.2–2; 252/79.1, 79.4
See application file for complete search history.

(56) References Cited

U.S. PATENT DOCUMENTS
5,334,332 A * 8/1994 Lee ............... 510/175
6,508,887 B1 * 1/2003 Park et al. .......... 134/2

FOREIGN PATENT DOCUMENTS
FR 2782079 A1 * 11/2000
KR 100335484 3/2000

* cited by examiner

Primary Examiner—Ha Tran Nguyen
(74) Attorney, Agent, or Firm—Harness Dickey & Pierce, P.L.C.

(57) ABSTRACT

A composition for stripping photoresist, methods of preparing and forming the same, a method of manufacturing a semiconductor device using the composition, and a method of removing a photoresist pattern from an underlying layer using the composition, where the composition may include an ethoxy N-hydroxyalkyl alkanamide represented by the formula, $CH_3CH_2-O-R_3-CO-N-R_1R_2OH$, an alkanolamine and a polar material. Raw materials of alkyl alkoxy alkanoate, represented by a chemical formula of $R_4-O-R_3-COOR_5$, and alkanolamine, represented by a chemical formula of $NHR_1R_2OH$, may be mixed to form a mixture, which is stirred and cooled to obtain the composition. The composition may balance exfoliation and dissolution of photoresist patterns, and may potentially eliminate thread-type residues from remaining on a surface of an underlying layer after removing the photoresist patterns.

26 Claims, 5 Drawing Sheets

COMPOSITION FOR STRIPPING PHOTORESIST AND METHOD OF PREPARING THE SAME

CROSS-REFERENCE TO RELATED CASES

This U.S. nonprovisional patent application claims priority under 35 U.S.C. § 119 of Korean Patent Application 002002-58469, filed on Sep. 26, 2002, the entire contents of which are hereby incorporated by reference.

BACKGROUND OF THE INVENTION

1. Field of the Invention

The present invention relates to a composition for stripping photoresist, methods of preparing and forming the same, a method of manufacturing a semiconductor device using the composition, and a method of removing a photoresist pattern from an underlying layer using the composition.

2. Description of the Related Art

The process of removing photoresist is an important step in manufacturing a semiconductor device. After completing various processes, such as an etching, ion implantation, etc., photoresist patterns, which typically may be used as a mask in one or more of the aforementioned processes, need to be removed. Additionally, if the photoresist patterns are misaligned, these may have to be removed in order to form new photoresist patterns, potentially delaying the manufacturing process. Further, beneath the photoresist patterns may reside one or more layers, such as an oxide layer, aluminum layer, copper layer, polysilicon layer, silicide layer, polyimide layer, etc. Thus, removing the photoresist patterns as soon as possible, and as clean as possible, without harming the underlying layer(s) is necessary in most, if not all, semiconductor device manufacturing processes.

A widely used composition for removing photoresist may include a basic amine compound and a polar solvent as main components, for example. The amine compound may be one of hydroxylamine, diglycol amine, mono-ethanol amine or methyl ethanol amine, for example, and the polar solvent may be water or alcohol.

However, these conventional photoresist removing compositions cannot completely remove polymer components (e.g., polymers) that may be formed during an process of etching the photoresist; thus a pre-treatment process for removing these polymers may be required. The polymers may be produced during plasma etching or reactive ion etching processes which use photoresist patterns as a mask in order to etch an underlying layer of the photoresist patterns, for example. The polymers may be produced through a reaction of the elements C, H, O, etc. in the photoresist patterns with the plasma, such that a polymer is formed on the underlying layer of the photoresist patterns. In particular, when a metal layer is formed under the photoresist patterns, an organo-metallic polymer may be produced. If these organo-metallic polymers are not removed (e.g., polymers remain in a contact hole or a via hole of a semiconductor wafer, for example) a contact resistance might be increased. Accordingly, a pre-treatment process, using a cleaning-intensifying agent for removing polymers, such as a nitric acid solution, for example, may be required prior to applying a photoresist removing composition.

Further, conventional photoresist removing compositions may actually damage an underlying layer. An underlying metal layer could be damaged, since the conventional photoresist removing compositions may include a basic solvent or water. Thus, the underlying metal layer may be subject to corrosion. In order to prevent corrosive damage, a post-treatment process may be performed after the photoresist removing composition is applied, but before performing a post-removal rinsing process. The post-treatment process may include cleaning the photoresist removing composition with isopropyl alcohol, for example.

Since a pre-treating process for removing the photoresist, and a post-removal rinsing process, may both have to be performed in order to remove the photoresist (and polymers related thereto) with a conventional photoresist removing composition, device processing time may be lengthened, potentially lowering productivity. In addition, the application of pre-treating materials and post-treating materials, in addition to the photoresist removing composition, increases production costs. Further, in order to implement pre- and post-treatment processes, corresponding, and different, baths are required, enlarging the size of an apparatus used for removing the photoresist.

In light of the above, Korean Patent No. 10-0335484 (the "484 patent", registered Apr. 23, 2002) discloses a photoresist removing agent including alkoxy N-hydroxyalkyl alkanamide, a stripping composition for removing photoresist, preparation methods thereof and a method of removing photoresist using the composition. The '484 patent describes a stripping composition having good removing characteristics for removing polymers and photoresist, and which may be used without harming an underlying layer. This composition may include alkoxy N-hydroxyalkyl alkanamide, a polar material having a dipole moment of about three (3) or more, a damage preventing agent and alkanol amine.

The damage preventing agent is added to prevent damage to various layers, such as metal layers, exposed after completing removal of the photoresist. The damage preventing agent may function as a dissolving agent for a reduced organic metal polymer, for example, to prevent corrosion and possible damage to exposed wiring on the surface of an integrated circuit (IC) substrate, for example. A metal oxide layer may be formed on the surface of the exposed wiring pattern, and reacted with a reducing agent so as to be changed into metal ions. During this reaction, a chelating reaction between the damage preventing agent and the metal ions occurs, forming a chelating compound. The surface portion of the exposed wiring pattern may then be covered with stable chelating compounds, preventing corrosion and possible damage to the wiring pattern. Thus, damage to an underlying layer may be prevented due to addition of a damage preventing agent. However, a side-effect of using the damage preventing agent may be a reduced attacking power of the photoresist and a reduced attacking power in removing the polymer formed on the surface portion of the exposed wiring pattern, potentially lowering an overall removing efficiency of a stripping composition containing the damage preventing agent.

After completing fabrication of a semiconductor device such as a chip, a pad and a lead frame may be connected for packaging each chip. The pad may be formed to a thickness of about 10,000 Å. Thus, photoresist patterns for forming the pad may need to be substantially thicker than thicknesses of photoresist patterns used for forming various layers under the pad. Accordingly, even though the photoresist patterns may be removed using an organic stripping composition, polymers in a general shape of a piece of thread, or "thread-type polymers", may remain, potentially inducing defects in the chip.

If an organic stripping composition and water are not sufficiently mixed, this may also cause the formation of residual thread-type polymers. Further, if the organic stripping composition has a high viscosity, the organic stripping composition might remain, even after a wafer rinsing process is performed, potentially causing further defects.

For example, stripping compositions made by conventional methods and currently available from various companies, when used to remove photoresist, cause the formation of the aforementioned residual thread-type polymers. The results are illustrated in FIGS. 1A–3, which illustrate views of pads containing such residual thread-type polymers.

FIGS. 1A and 1B are views illustrating removing effects of photoresist after removing a photoresist with a prior art stripping composition prepared by a conventional process. FIG. 1A was obtained after applying a stripping composition for the manufacture of 256M DRAM, and FIG. 1B was obtained after applying the stripping composition for the manufacture of 128M DRAM. The applied stripping composition is available from EKC Co., Ltd., and includes hydroxylamine, water, an organic solvent excluding amide, a chelating agent, etc.

As shown in FIGS. 1A and 1B, thread-type residues (defects) were observed. After inspecting 100 pads per wafer, about 20% of the pads for the 256M DRAM contained these defects, and thread-type residues were seen in about 80% of the pads for the 128M DRAM.

FIGS. 2A and 2B are views illustrating removing effects of photoresist after removing a photoresist with another prior art stripping composition prepared by another conventional process. FIG. 2A was obtained after applying a stripping composition for the manufacture of 256M DRAM, and FIG. 23B was obtained after applying the stripping composition for the manufacture of 128M DRAM. The applied stripping composition is available from Dong Woo Fine Chemical Co., Ltd., and includes methoxy N-hydroxyethyl propanamide, water, ethanolamine, catechol (a chelating agent), a damage preventing agent, etc. This stripping composition is disclosed in the '484 patent discussed above.

As shown in FIGS. 2A and 2B, thread-type residues were observed. After inspecting 100 pads per wafer, about 50% of the pads for the 256M DRAM contained these defects, and thread-type residues were seen in about 70% of the pads for the 128M DRAM.

FIG. 3 is a view illustrating removing effects of photoresist after removing a photoresist with a further prior art stripping composition prepared by a further conventional process. FIG. 3 was obtained after applying a stripping composition for the manufacture of 256M DRAM. The applied stripping composition is available from ACT Co., Ltd., and includes amine, water, an organic solvent excluding amide, a chelating agent, etc. As shown in FIG. 3, thread-type residues were observed. After inspecting 100 pads per wafer, about 80% of the pads for the 256M DRAM contained these defects.

Images shown in FIGS. 1A and 3 are obtained using Scanning Electron Microscope (SEM) from Hitachi, Ltd.

SUMMARY OF THE INVENTION

Exemplary embodiments of the present invention are directed to a composition for stripping or removing photoresist that excludes a damage preventing agent, and which may include specialized components to balance exfoliation and dissolution of the photoresist, in a process of forming a pad, for example. Advantageously, the composition may be prepared so as to form a pad at lower costs. Defects due to thread-type polymers (which may lower pad quality after completing a pad-forming step, for example) may be prevented or eliminated with a composition for stripping photoresist according to the exemplary embodiments of the present invention.

In an exemplary embodiment, the present invention is directed to a composition for removing photoresist. The composition may include an ethoxy N-hydroxyalkyl alkanamide represented by chemical formula $CH_3CH_2$—O—$R_3$—CO—N—$R_1R_2OH$, an alkanolamine and a polar material. In the chemical formula, $R_1$ may be at least one of an H atom, a hydrocarbonyl group including 1–5 carbons and an aromatic hydrocarbonyl group including 1–3 benzene rings. $R_2$ may be a hydrocarbon including 1–5 carbons or an aromatic hydrocarbon including 1–3 rings, and R3 may be a hydrocarbon including 1–5 carbons.

In another exemplary embodiment, the present invention is directed to a method of preparing a composition for removing photoresist. Raw materials of alkanolamine, represented by the chemical formula $NHR_1R_2OH$ and alkyl alkoxy alkanoate represented by the chemical formula $R_4$—O—$R_3$—$COOR_5$ my be mixed to form a mixture. $R_1$ may be one of an H atom, a hydrocarbonyl group including 1–5 carbons and an aromatic hydrocarbonyl group including 1–3 benzene rings. $R_2$ may be a hydrocarbon including 1–5 carbons or an aromatic hydrocarbon including 1–3 benzene rings, and R3 may be a hydrocarbon including 1–5 carbons. In the chemical formula for alkyl alkoxy alkanoate, R4 and R5 each may be carbonyl groups including 1–5 carbons. The mixture is stirred to form a product, and the product is then cooled. A polar solvent may be added in the mixing step or after cooling to the product in order to form the stripping composition.

In another exemplary embodiment, the present invention is directed to a method of manufacturing a semiconductor device using a stripping composition. A metallic layer may be formed on a substrate, and a photoresist pattern may be formed on the metallic layer. The metallic layer may be etched using the photoresist pattern as a mask. The photoresist pattern may be removed with a composition including an ethoxy N-hydroxyalkyl alkanamide represented by the chemical formula $CH_3CH_2$—O—$R_3$—CO—N—$R_1R_2OH$, an alkanolamine and a polar material. In the chemical formula, $R_1$ may be one of an H atom, a hydrocarbonyl group including 1–5 carbons and an aromatic hydrocarbonyl group including 1–3 benzene rings. $R_2$ may be a hydrocarbon including 1–5 carbons or an aromatic hydrocarbon including 1–3 benzene rings, and $R_3$ may be a hydrocarbon including 1–5 carbons.

In another exemplary embodiment, the present invention is directed to method of forming a composition for removing photoresist. An alkyl alkoxy alkanoate and alkanolamine may be mixed to form a mixture, and the mixture may be stirred and cooled to form a composition of ethoxy N-hydroxyethyl propanamide and ethanolamine.

In a further exemplary embodiment, the present invention is directed to a method of removing a photoresist pattern from an underlying layer. A composition may be applied on the photoresist pattern and underlying layer to remove the photoresist. The composition may include an ethoxy N-hydroxyalkyl alkanamide, an alkanolamine and a polar material. A surface of the underlying layer may then be rinsed to remove any remaining composition.

BRIEF DESCRIPTION OF THE DRAWINGS

Exemplary embodiments of the present invention will become more fully understood from the detailed description given hereinbelow and the accompanying drawings, wherein like elements are represented by like reference numerals, which are given by way of illustration only and thus are not limitative of exemplary embodiments the present invention and wherein.

DETAILED DESCRIPTION OF THE EXEMPLARY EMBODIMENTS

Figure 1A:
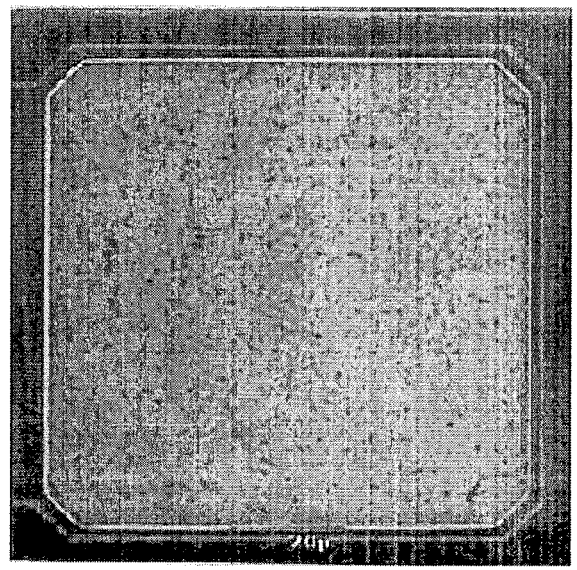
FIGS. 1A and 1B are views illustrating removing effects of photoresist after removing a photoresist with a prior art stripping composition prepared by a conventional process.
Figure 1B:
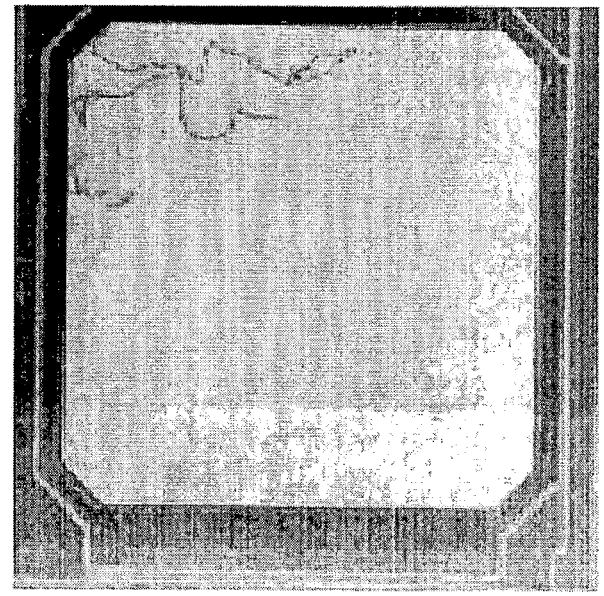
Figure 2A:
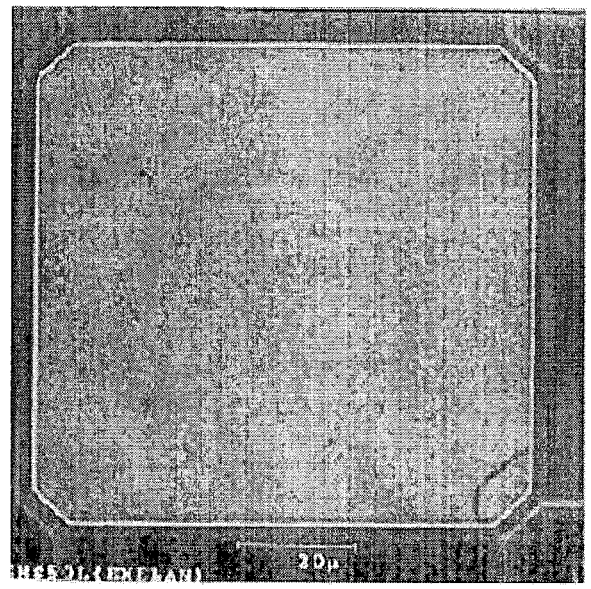
FIGS. 2A and 2B are views illustrating removing effects of photoresist after removing a photoresist with another prior art stripping composition prepared by another conventional process.
Figure 2B:
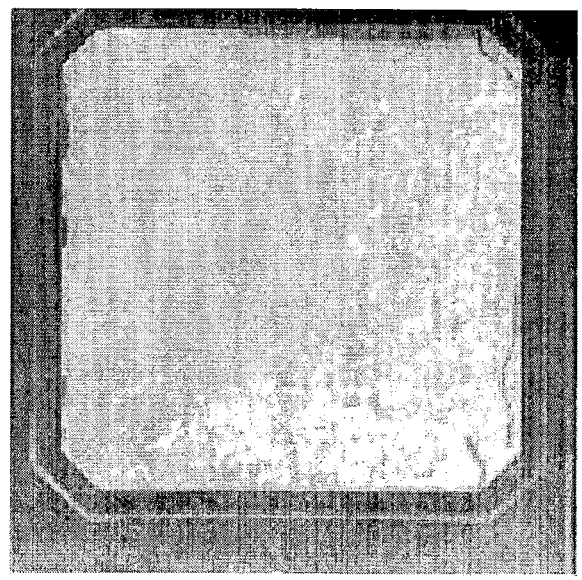
Figure 3:
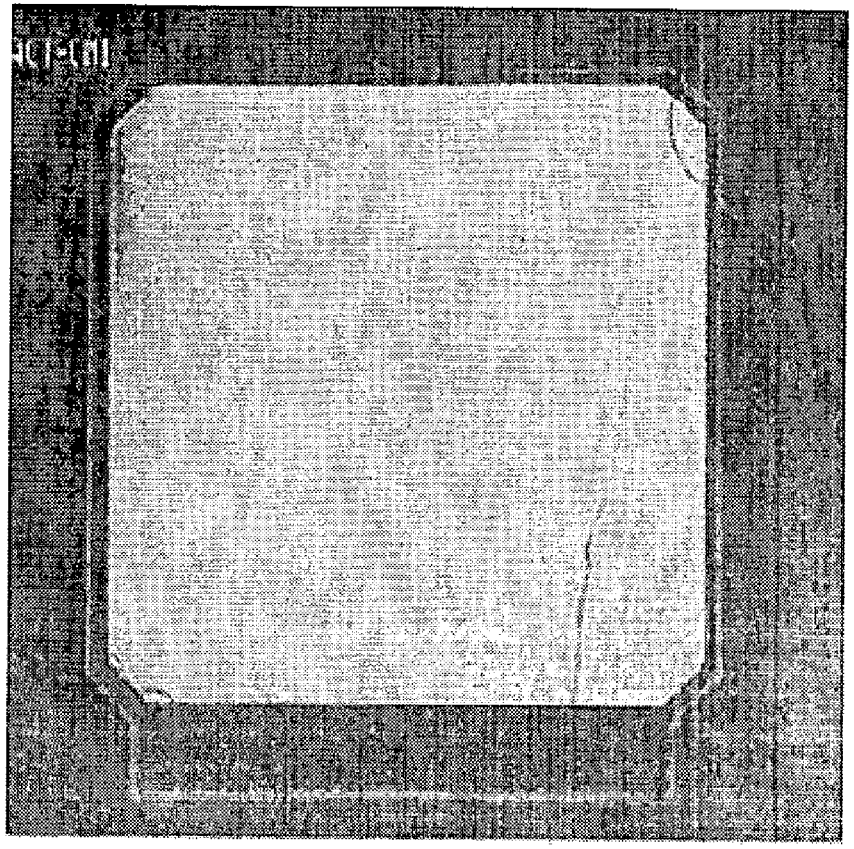
FIG. 3 is a view illustrating removing effects of photoresist after removing a photoresist with a further prior art stripping composition prepared by a further conventional process.

Hereinafter, exemplary embodiments of the present invention will be described in detail with reference to the attached drawings. However, the exemplary embodiments of the present invention can be modified into various other forms, and the scope of the present invention must not be interpreted as being restricted to the exemplary embodiments. The exemplary embodiments are provided to more completely explain the present invention to those skilled in the art. When it is written that a layer may be formed "on" another layer or a substrate, the layer can be formed directly on the other layer or the substrate, or other layers can intervene therebetween.

A composition for stripping photoresist according to an exemplary embodiment of the present invention may include an ethoxy N-hydroxyalkyl alkanamide represented by the following chemical formula:

$$CH_3CH_2—O—R_3—CO—N—R_1R_2OH, \quad (1)$$

where $R_1$ may represent at least one of an H atom, a hydrocarbonyl group including 1–5 carbons, and an aromatic hydrocarbonyl group including 1–3 benzene rings, $R_2$ may represent hydrocarbon including 1–5 carbons, or aromatic hydrocarbon group including 1–3 benzene rings, and $R_3$ may represent a hydrocarbon group including 1–5 carbons, for example.

Ethoxy N-hydroxy alkyl alkanamide includes functional groups of a hydroxy group (—OH), an ethoxy group ($CH_3CH_2O$—) and a carbonyl group (—C═O), and may be used for exfoliation and dissolution of the photoresist and polymer. This compound may be reacted with a polymer such as an organic-metallic polymer, for example, in order to remove the photoresist and polymer, as illustrated in the following reaction equation (I).

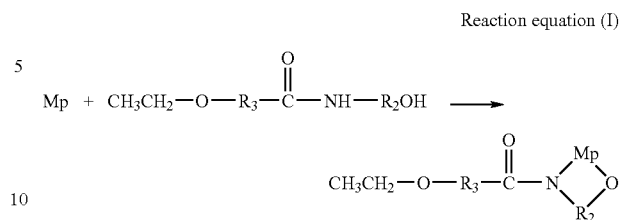

Reaction equation (I)

In reaction equation (I), Mp may represent a polymer such as an organic-metallic polymer, and $R_2$ and $R_3$ may represent the groups as defined above.

The amount of ethoxy N-hydroxyalkyl alkanamide added in a resultant stripping composition may be in a range of about 10–90% by weight, based on the total amount of stripping composition. The amount of ethoxy N-hydroxyalkyl alkanamide less than 10% by weight may be insufficient to remove the polymer within the photoresist; and an amount of ethoxy N-hydroxyalkyl alkanamide exceeding 90% by weight may damage an exposed underlying layer in a stripping process.

The stripping composition as described in the exemplary embodiments of the invention may include an N-hydroxyalkyl alkanamide containing an ethoxy group as a component. The stripping composition, including the compound containing the ethoxy group, may be more effective in removing photoresist, as compared to a stripping composition that includes an N-hydroxyalkyl alkanamide containing a methoxy group, for example. This is because if a stripping composition, including a methoxy N-hydroxyalkyl alkanamide, is used for the removal of photoresist patterns (in a process of forming a pad, for example) the color of the pad may change after removal of the photoresist patterns, and some pieces of thread-shaped residues may exist.

However, when a stripping composition including ethoxy N-hydroxyalkyl alkanamide is used, these defects are not generated. This may be because a stripping composition with ethoxy group may have a better attacking characteristic on the photoresist, so as to improve a removing power thereof.

A composition for stripping photoresist in the exemplary embodiments of the present invention may include alkanolamine. Alkanolamine may be as effective in removing polymers such as organic-metallic polymers as is ethoxy N-hydroxyalkyl alkanamide, and may be represented by the following chemical formula:

$$NHR_1R_2OH, \quad (2)$$

where $R_1$ may represent an H atom, a hydrocarbonyl group including 1–5 carbons, or an aromatic hydrocarbonyl group including 1–3 benzene rings, and $R_2$ may represent hydrocarbon including 1–5 carbons or aromatic hydrocarbon including 1–3 benzene rings.

A reaction mechanism of this compound with an organo-metallic polymer is illustrated in the following reaction equation (II), where mono-alkanolamine is used as the alkanolamine.

Reaction equation (II)

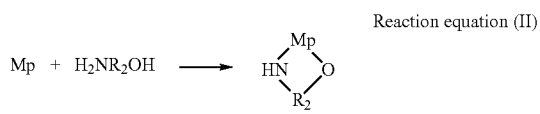

In reaction equation (II), Mp may represent an organometallic polymer and R2 may represent the group as described above in the immediately preceding paragraph.

Alkanolamine, which may have as good effect in removing photoresist and polymer as does ethoxy N-hydroxyalkyl alkanamide, may be added to polar material used to form the polar solvent, so as to increase the removing power for removing photoresist. The amount of alkanolamine added may be in a range of about 0.01–40% by weight, based on the total amount of the stripping composition.

The composition for stripping photoresist in accordance with exemplary embodiments of the present invention may also include a polar material having a dipole moment of at least three (3). Possible candidates for the polar material may include one or more of water, methanol, dimethylsulfoxide, etc, used alone or combined in a mixture as the polar solvent, for example. The polar material may have a high dissolution power, such that polymer components attached onto side wall portions of the photoresist patterns, and/or on a surface portion of an exposed underlying layer, may be removed, in addition to the photoresist patterns.

The amount of polar material added may be in a range of about 0.01–50% by weight, based on the total amount of the composition. The amount of polar material used is not limited to a certain range, since the polar material may also function as a solvent (e.g., polar solvent). Therefore, an appropriate amount of polar material may be determined based on a desired amount to mix with a main component (e.g., ethoxy N-hydroxyalkyl alkanamide, for example), and/or based on a desired viscosity of a thus obtained composition.

In a composition for stripping photoresist that includes the above-described three components (ethoxy N-hydroxyalkyl alkanamide, alkanolamine, polar material having a dipole moment of at least three (3)) according to the exemplary embodiments of the present invention, a chelate forming compound, which could be added as a damage preventing agent to protect an exposed underlying layer after removing the photoresist patterns, is excluded. In particular, polymers generated in the fabrication/formation of a pad remain as thread-shaped residues. Thus, since the stripping composition is prepared without a damage preventing agent, a "polymer protecting function" may be eliminated, potentially increasing a removing power for removing polymers from the photoresist patterns, and/or the surface portion of the exposed underlying layer.

A method of preparing alkoxy N-hydroxyalkyl alkanamide, used in the composition in accordance with exemplary embodiments of the present invention, will be explained hereinbelow. Alkoxy N-hydroxyalkyl alkanamide may be prepared by reacting alkyl alkoxy alkanoate with alkanolamine in the following reaction equation (III).

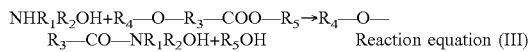

Reaction equation (III)

In reaction equation (III), $R_1$ may represent an H atom, a hydrocarbonyl group including 1–5 carbons, or an aromatic hydrocarbonyl group including 1–3 benzene rings. $R_2$ may represent hydrocarbon including 1–5 carbons or aromatic hydrocarbon including 1–3 benzene rings. $R_3$ may represent hydrocarbon including 1–5 carbons; $R_4$ and $R_5$ each may represent a hydrocarbonyl group including 1–5 carbons.

Mono-ethanolamine, in which $R_1$ may be an H atom and $R_2$ may be —$CH_2CH_2$—, may be used for the alkanolamine, for example. Ethyl ethoxy propanoate, in which $R_3$ may be —$CH_2CH_2$—, and where both R4 and R5 may be —$CH_2CH_3$, may be used for the alkyl alkoxy alkanoate.

A reaction temperature may be in a range from about room temperature (e.g., from about 25° C.) to about 120° C. in order to supply sufficient energy for reaction. More preferably, the reaction temperature may be maintained in a range of about 50–85° C. As illustrated in reaction equation (III), amine and ester react with each other to produce amide and alcohol. The alcohol includes about 1–5 carbons and has a low boiling point (65° C. for methanol, 78° C. for ethanol), while the amide compound has a high boiling point (about 200° C. for methoxy N-hydroxyethyl propanamide). Therefore, the amide compound may be readily separated by removing the alcohol compound, such as by using a fractional distillation process, for example, after the reaction is complete. During the fractional distillation process, distillation can be accelerated by bubbling nitrogen gas in a reaction flask, for example, and the evaporation of alcohol may be accelerated by lowering the pressure in the reaction flask. Both of these two techniques (e.g., to accelerate distillation and evaporation) may be applied simultaneously.

The stripping composition may be prepared by mixing about 10–90%, by weight, of alkoxy N-hydroxyalkyl alkanamide, about 0.01–40% by weight of alkanolamine, and about 0.01–50% by weight of the polar material, as based on the total amount of stripping composition.

The inventors have developed a method of preparing a composition for stripping photoresist by a process that does not separate the alkoxy N-hydroxyalkyl alkanamide. The stripping composition may be prepared in a single step (e.g., "one-step process") as will be hereafter described in further detail.

Initially, alkanolamine, represented by chemical formula (2) previously described (e.g., $NHR_1R_2OH$), and alkyl alkoxy alkanoate, represented by the following chemical formula (3), are mixed as starting materials.

(3)

In chemical formula (3), $R_3$ may represent hydrocarbon having 1–5 carbons, and $R_4$ and $R_5$ may each represent a hydrocarbonyl group having 1–5 carbons. During the reaction while stirring the mixture, any produced alcohol is removed continuously, and then the mixture is cooled after the reaction is complete.

A method of preparing a composition for stripping the photoresist will be described referring to the exemplary embodiments.

For starting raw materials, a compound having a chemical formula of (2), where $R_1$ may represent a H atom and $R_2$ may represent —$CH_2CH_2$—, and a compound having the chemical formula of (3), where $R_3$ represents —$CH_2CH_2$— and $R_4$ and $R_5$ represent —$CH_2CH_3$, may be used. Reaction between these two compounds may be indicated by the following reaction equation (IV)

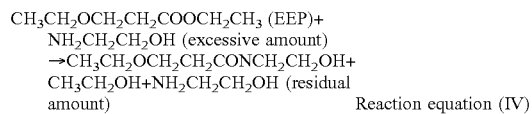

Reaction equation (IV)

Ethyl ethoxy propanoate (EEP) and ethanolamine are added as starting materials into a reaction vessel, mixed and stirred. A mixing ratio for mixing ethyl ethoxy propanoate and ethanolamine may be in a range of about 1:1±0.5 by volume. The stirring may be continued at a temperature of about 50–85° C. for about 5–15 hours. Ethyl alcohol produced during the stirring may be continuously removed by using a difference in boiling points between compounds present within the vessel, for example. After a peak of ethyl ethoxy propanoate disappears (e.g., when detecting peaks of each compound by gas chromatography, for example) and the reaction is complete, only ethoxy N-hydroxyethyl propanamide and ethanolamine remain. According to the exemplary embodiment(s), an excessive amount of acetate may be used, as compared to an amount of ethanolamine by mole, so that an excess amount of acetate remains after the reaction is complete. The amount of acetate may be determined in advance, so that a desired excess amount remains for the preparation of the stripping composition. In using the method described above, the product of the reaction (e.g., ethoxy N-hydroxyethyl propanamide and ethanolamine) does not have to undergo a separate purification process.

After cooling the product, a polar material having a dipole moment of at least three (3), and a polar material selected from one of water, methanol and dimethylsulfoxide, for example, may be added in order to prepare the stripping composition in accordance with an exemplary embodiment of the present invention. The amount of the polar material added may be in a range of about 0.01–50%, by weight, as based on the total amount of the composition.

Alternatively, the polar material described above may be added at the mixing step of the two starting materials. At this time, any residual materials remaining in the vessel become components of the stripping composition. When the polar material is mixed, a mixing ratio of alkyl alkoxy alkanoate, alkanolamine and the polar material may be in a range of about 1.5–2.5: 1.5–2.5: 0.5–1.5, by volume, in order to prepare the stripping composition.

In the above-described exemplary embodiment, a compound having chemical formula (2), where $R_1$ is an H atom and $R_2$ is —$CH_2CH_2$—, and a compound having chemical formula (3), where $R_3$ is —$CH_2CH_2$— and where $R_4$ and $R_5$ are —$CH_2CH_3$, were used as starting materials. The product of mixing was ethoxy N-hydroxy alkanamide. Therefore, in order to produce methoxy N-hydroxy alkanamide, a compound having chemical formula (2) wherein $R_1$ is H atom and $R_2$ is —$CH_2CH_2$—, and a compound having chemical formula (3), where $R_3$ is —$CH_2CH_2$— and where $R_4$ and $R_5$ are —$CH3$, may be used as the starting materials. At this time, the reaction may proceed by the following reaction equation (V).

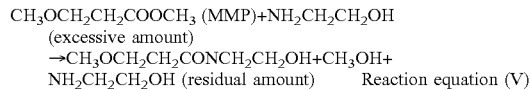

Methoxy methyl propanoate (MMP) may be used as the acetate starting material, with an alcohol produced being methanol. This reaction may be performed according to the manner described above, regarding EEP, for example. However, MMP is more expensive than EEP, and the treatment of MMP is more difficult than the treatment of EEP. In addition, the produced alcohol (methanol) is more toxic than ethanol; which may complicate experimental conditions. Accordingly, when considering experimental conditions for the preparation, and the removing efficiency, of photoresist patterns (to be used for forming a pad, for, example) the application of ethoxy N-hydroxyethyl alkanamide is more favorable than that of methoxy N-hydroxyethyl alkanamide as a starting material.

Hereinafter, a method of forming a pad that may be used in the manufacture of a semiconductor device, for example, will be described.

After completing manufacture of a semiconductor device, a packaging process may be implemented. The packaging process may be significant for several reasons: a chip (or a die) may achieve a physical and electrical connection with a system, highly integrated and minutely designed circuits may be protected from external surroundings, inner circuits and outer circuits may be stably connected, and the circuits may be protected from a high temperature during operation of the chip. Therefore, the reliability and performance of highly integrated circuits can be maintained through proper packaging. The packaging process is a finishing step in the design of a semiconductor chip, and is an important technique for determining a size, price and performance of a chip.

When the manufacturing process of highly integrated circuits is finished, a wafer containing the highly integrated circuits may be cut along scribe lines into a die unit. Damaged dies may be cast away, and satisfactory dies (dies which succeed in certain tests) may be gathered for packaging.

A wafer may have a diameter of about 10–30 cm, for example, and the size surface area of each chip may be in a range from about several $mm^2$ to about several tens of $mm^2$ (e.g., 2–50 $mm^2$, for example). Basic elements of the packaging may include a lead frame, a bonding wire and a die. The lead frame may be represented as pins protruding to the exterior of the package, called lead lines, pins, etc. The bonding wire may be embodied as a metal line connecting the silicon die pad. The lead frame and this connecting process may be referred to as a wire bonding process.

As previously discussed, a pad and a lead frame may be connected for packaging each chip. The pad may be connected to the lead frame during the packaging process, and may be formed as metal patterns during finishing steps of the manufacture of the semiconductor device, for example. Generally, the pad may be formed using a suitable metal such as aluminum.

Figure 4:
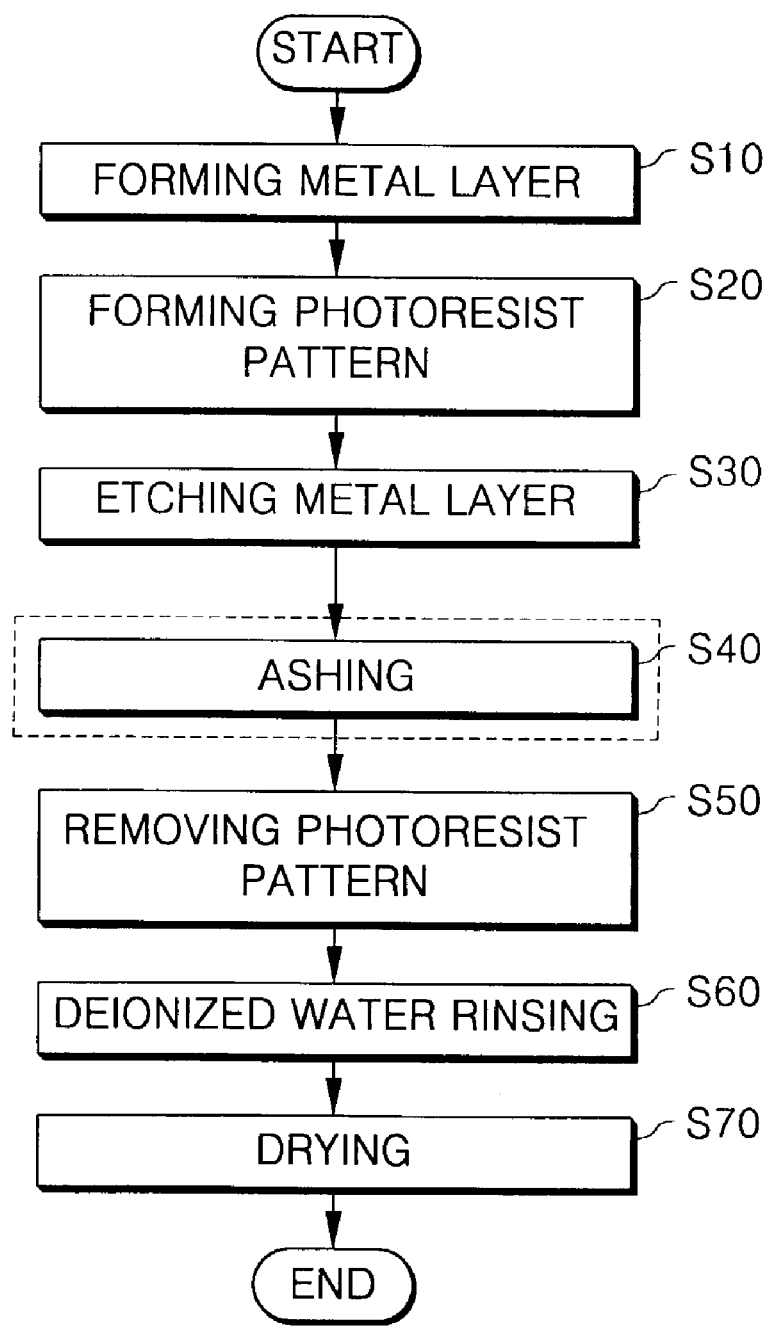
FIG. 4 is a flow chart describing a method of manufacturing a semiconductor device according to an exemplary embodiment of the present invention.

The process of removing or stripping photoresist in forming the pad, by using the stripping composition in accordance with exemplary embodiments of the present invention, may be described referring to FIG. 4, which is a flow chart describing a method of manufacturing a semiconductor device according to an exemplary embodiment of the present invention.

A metallic layer may be formed (step S10) to a thickness of about 10,000 Å, by depositing a metallic material such as aluminum, for example, on a substrate. On the metallic layer, photoresist may be coated and then dried to form a photoresist layer. The photoresist layer may be exposed by using a mask of a predetermined pattern and then developed to form photoresist patterns (step S20). The metallic layer may be etched (step S30) using the photoresist pattern as a mask, for example.

After etching, the photoresist patterns may be removed by a suitable ashing treatment (step S40), which is a dry stripping process. This ashing treatment may be optional (it may be omitted), as indicated by the dotted-lined box around step S40. Then, the photoresist patterns may be removed (step S50) using a composition for stripping photoresist according exemplary embodiments of the present invention.

Treatment with the stripping composition may be implemented by dipping the substrate into a bath which includes the stripping composition, or by spraying the stripping composition onto the substrate, for example. Removing the photoresist with the stripping composition may be performed at a temperature of about 70° C. or lower, for example. The removing step (step S50) may be performed in a temperature range from about room temperature (e.g., 25° C.) to about 70° C., and more preferably in a range of about 45–70° C. A time period for contact (e.g., contact time) of the photoresist patterns with the stripping composition may be determined as desired. For example, the contact time may be in a range of about 10 to 30 minutes.

The stripping composition in accordance with exemplary embodiments of the present invention may be used for removal of photoresist for a light source of i-line having a wavelength of about 365 nm, for example, for photoresist for a light source of a KrF excimer laser having a wavelength of about 248 nm, and for a photoresist for a light source having a short wavelength, such as an ArF excimer laser, having a wavelength of about 193 nm.

After the photoresist patterns are removed, any stripping composition remaining on the surface portion of the substrate and dissolved photoresist may be rinsed (step S60). The rinsing may be performed using one or more rinsing iterations of de-ionized water, for example. The substrate may then be dried (step S70) to complete formation of the pad. The substrate may be dried by a spin dry process, for example, or by using isopropyl alcohol to remove any de-ionized water remaining on a surface portion of the substrate.

Generally, the metallic layer for forming the pad is thick, as compared to layers beneath the pad, such as layers of the chip. The metallic layer may have a thickness of about 10,000 Å, for example. Accordingly, the photoresist patterns formed on the metallic layer may also be thick. When removing the photoresist patterns (after completing photolithography, for example), a stripping composition having a stronger removing efficiency (than what would be applied for removing photoresist patterns from a layer of a chip, for example), should be applied. In practice, during a developing process for forming the photoresist patterns, damage may be observed on an underlying layer, such as an aluminum metal layer, for example, to a depth of several thousand angstroms (Å) (e.g., 1000–4000 Å) when the underlying layer is inspected using X-ray Fluorescence (XRF) spectrometry. However, when performing a stripping process using the stripping composition in accordance with the exemplary embodiments, observed damage on an underlying layer is only to a depth on the order of several Å (e.g., 2–10 Å) when the underlying layer is inspected using X-ray Fluorescence (XRF) spectrometry.

But, since the photoresist patterns used in forming the pad may be thick (as compared to a photoresist pattern used in forming a layer of the chip), observed damage on an underlying layer may be substantially insignificant or trivial. Thus, in accordance with the exemplary embodiments of the present invention, a stripping composition (without a damage preventing agent) may be used without generating significant damage on the underlying layer. In addition, since a damage preventing agent is not present, polymer removing efficiency may be improved (i.e., for removing thread-type polymers).

Further, since the stripping composition in accordance with the exemplary embodiments of the present invention has a good removing efficiency for removing both the polymer and photoresist, the pre-treatment process described above is not required. Accordingly, a process for removing photoresist may be simplified.

Examples will be described in detail below. However, it should be understood that the exemplary embodiments of the present invention should not be limited to the following examples.

EXAMPLE 1

In the following example, 200 ml of ethyl ethoxy propanoate and 200 ml of ethanolamine were added, and then stirred, in a reaction vessel. The reaction vessel was provided with fractional distillation equipment, a thermometer and a magnetic bar. A reaction temperature was raised to about 80° C., and the reaction was continued for about 10 hours, while continuously removing ethanol (produced in the reaction) by a fractional distillation process. When a peak amount of ethyl ethoxy propanoate was detected, removed and examined (e.g., when a peak of the compound was detected by gas chromatography, for example), the reaction was halted and the product (of the reaction) was cooled. After cooling, a mixture of ethoxy N-hydroxyethyl propanamide and ethanolamine was obtained, without having to perform a separate purification process. Thereafter, 100 ml of water were added to the mixture of ethoxy N-hydroxyethyl propanamide and ethanolamine and mixed to prepare the stripping composition in accordance with an exemplary embodiment of the present invention.

EXAMPLE 2

In the following example, 200 ml of ethyl ethoxy propanoate, 200 ml of ethanolamine, and 100 ml of water were added to a reaction vessel and stirred. The reaction vessel was provided with fractional distillation equipment, a thermometer and a magnetic bar. A reaction temperature was raised to about 80° C., and the reaction was continued for about 10 hours, while continuously removing ethanol (produced in the reaction) by a fractional distillation process. When a peak amount of ethyl ethoxy propanoate was detected, removed and examined (e.g., when a peak of the compound was detected by gas chromatography, for example), the reaction was halted and the product (of the reaction) was cooled. After cooling, a stripping composition in accordance with an exemplary embodiment of the present invention was formed, including ethoxy N-hydroxyethyl propanamide, ethanolamine and water, without having to perform a separate purification process.

EXAMPLE 3

A stripping composition including ethoxy N-hydroxyethyl propanamide, N,N-di-t-butyl ethanolamine and water was prepared in the same manner as in Example 1, except 200 ml of N,N-di-t-butyl ethanolamine was added instead of 200 ml of ethanolamine.

In order to determine the removing efficiency of the stripping composition in accordance with the exemplary embodiments of the present invention, residual materials remaining on the pad were examined after removing photoresist patterns using the stripping composition, similar to as was done with the prior art compositions of FIGS. 1A–3.

Figure 5A:
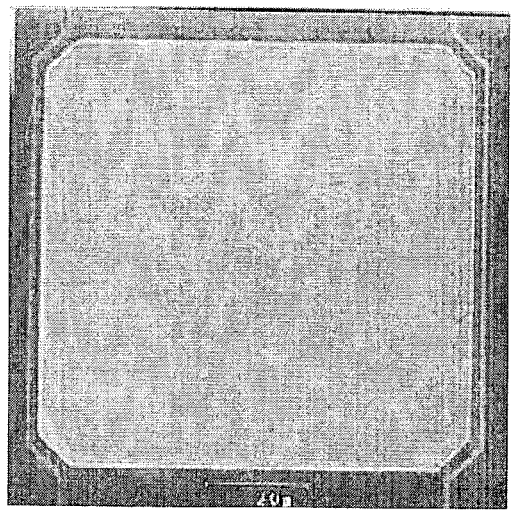
FIGS. 5A and 5B are views illustrating removing effects of photoresist after removing the photoresist using a stripping composition in accordance with an exemplary embodiment of the present invention.
Figure 5B:
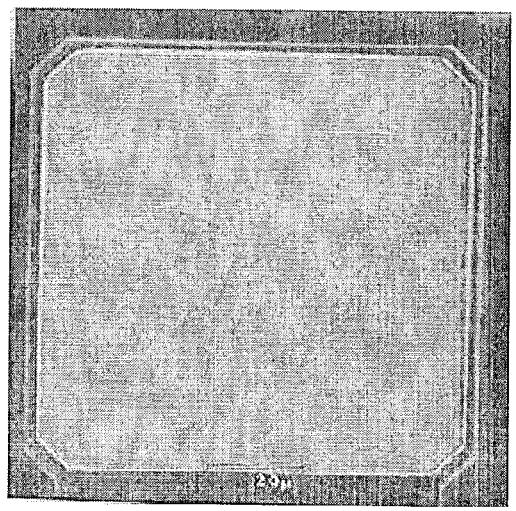

FIGS. 5A and 5B are views illustrating removing effects of photoresist after removing the photoresist using a stripping composition in accordance with an exemplary embodiment of the present invention. FIG. 5A was obtained after applying the stripping composition for the manufacture of 256M DRAM, and FIG. 5B was obtained after applying the stripping composition for the manufacture of 128M DRAM.

The applied stripping composition included ethoxy N-hydroxyethyl propanamide, water, and ethanolamine. As shown in FIGS. 5A and 5B, no thread-type residues were observed. After inspecting 100 pads per wafer, no residual thread-type polymer residues were observed in the manufacture of either the 256M DRAM or 128M DRAM. Images shown in FIGS. 5A and 5B are obtained using Scanning Electron Microscope (SEM) from Hitachi, Ltd.

As described in the exemplary embodiments, a composition for stripping photoresist patterns is provided, which may balance exfoliation and dissolution of photoresist patterns, and on which no thread-type residues remain after removing the photoresist patterns. Accordingly, possibility of generation of chip defects due to residual polymers is reduced.

In addition, when preparing a stripping composition according to exemplary embodiments of the present invention, the composition may be advantageously prepared in a one-step process that is economic and easy to implement, since the process generates little toxic compounds.

When a stripping composition is prepared in accordance with exemplary embodiments of the invention for removing photoresist (such as in a process of forming a pad, for example), an ashing step may be omitted in order to improve productivity and efficiency of equipment used in the manufacturing process, potentially lowering production costs.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A composition for removing photoresist from an underlying layer, comprising:
   ethoxy N-hydroxyalkyl alkanamide represented by chemical formula $CH_3CH_2—O—R_3—CO—N—R_1R_2OH$, alkanolamine and a polar material;
   wherein $R_1$ is at least one of an H atom, a hydrocarbonyl group including 1 to 5 carbons or an aromatic hydrocarbonyl group including 1 to 3 benzene rings, $R_2$ is a hydrocarbon including 1 to 5 carbons or an aromatic hydrocarbon including 1 to 3 benzene rings, and $R_3$ is a hydrocarbon including 1 to 5 carbons, the composition removing the photoresist without leaving any thread-shaped residues on the underlying layer.

2. The composition of claim 1, wherein $R_1$ is an H atom and $R_2$ and $R_3$ each are $—CH_2CH_2—$ in the chemical formula.

3. The composition of claim 1, wherein an amount of ethoxy N-hydroxyalkyl alkanamide is in a range of about 10 to 90%, by weight, based on a total amount of the composition.

4. The composition for removing photoresist as claimed in claim 1, wherein
   the alkanolamine is a compound represented by chemical formula $NHR_1R_2OH$,
   $R_1$ is selected from one of an H atom, a hydrocarbonyl group including 1 to 5 carbons and an aromatic hydrocarbonyl group including 1 to 3 benzene rings, and
   $R_2$ is a hydrocarbon including 1 to 5 carbons or aromatic hydrocarbon including 1 to 3 benzene rings.

5. The composition of claim 1, wherein an amount of the alkanolamine is in a range of about 0.01 to 40%, by weight, based on a total amount of the composition.

6. The composition of claim 1, wherein a dipole moment of the polar material is at least three (3), and an amount of the polar material is in a range of about 0.01 to 50%, by weight, based on a total amount of the composition.

7. The composition of claim 1, wherein the polar material is at least one compound selected from the group consisting of water, methanol and dimethylsulfoxide.

8. The composition of claim 1, wherein the photoresist is used in forming a pad.

9. The composition of claim 8, wherein the pad comprises aluminum.

10. A composition for removing photoresist from an underlying layer, comprising:
    ethoxy N-hydroxyalkyl alkanamide represented by chemical formula $CH_3CH_2—O—R_3—CO—N—R_1R_2OH$, alkanolamine and a polar material;
    wherein $R_1$ is at least one of an H atom, a hydrocarbonyl group including 1 to 5 carbons or an aromatic hydrocarbonyl group including 1 to 3 benzene rings, $R_2$ is a hydrocarbon including 1 to 5 carbons or an aromatic hydrocarbon including 1 to 3 benzene rings, and $R_3$ is a hydrocarbon including 1 to 5 carbons, the composition removing the photoresist without leaving any thread-shaped residues on the underlying layer
    wherein the composition is formed by a method comprising: mixing raw materials of alkanolamine represented by the chemical formula $NHR_1R_2OH$ and alkyl alkoxy alkanoate represented by the chemical formula $R_4—O—R_3—COOR_5$ to form a mixture, wherein $R_1$ is one of an H atom, a hydrocarbonyl group including 1 to 5 carbons and an aromatic hydrocarbonyl group including 1 to 3 benzene rings, $R_2$ is a hydrocarbon including 1 to 5 carbons or an aromatic hydrocarbon including 1 to 3 benzene rings, Ra is a hydrocarbon including 1 to 5 carbons, and $R_4$ and $R_5$ each are hydrocarbonyl groups including 1 to 5 carbons; stirring the mixture to form a product', and cooling the product.

11. A method of manufacturing a semiconductor device, comprising:
    forming a metallic layer on a substrate;
    forming a photoresist pattern on the metallic layer;
    etching the metallic layer using the photoresist pattern as a mask; and
    removing the photoresist pattern without leaving any thread-shaped residues on the metallic layer with a composition including an ethoxy N-hydroxyalkyl alkanamide represented by the chemical formula $CH_3CH_2—O—R_3—CO—N—R_1R_2OH$, an alkanolamine and a polar material,
    wherein $R_1$ is one of an H atom, a hydrocarbonyl group including 1 to 5 carbons and an aromatic hydrocarbonyl group including 1 to 3 benzene rings, $R_2$ is a hydrocarbon including 1 to 5 carbons or an aromatic hydrocarbon including 1 to 3 benzene rings, and $R_3$ is a hydrocarbon including 1 to 5 carbons.

12. The method of claim 11, further comprising performing an ashing process.

13. The method of claim 12, wherein said ashing process is performed after said etching, said performing an ashing process further including performing a dry stripping process.

14. The method of claim 11, further comprising performing a rinsing process using de-ionized water after said removing of said photoresist pattern.

15. The method of claim 11, wherein $R_1$ is an H atom and $R_2$ and $R_3$ each are $—CH_2CH_2—$ in the chemical formula.

16. The method of claim 11, wherein an amount of ethoxy N-hydroxyalkyl alkanamide is in a range of about 10 to 90%, by weight, based on a total amount of the composition.

17. The method of claim 11, wherein the alkanolamine is a compound represented by the chemical formula $NHR_1R_2OH$,
- $R_1$ is one of an H atom, a hydrocarbonyl group including 1 to 5 carbons and an aromatic hydrocarbonyl group including 1 to 3 benzene rings, and
- $R_2$ is a hydrocarbon including 1 to 5 carbons or an aromatic hydrocarbon including 1 to 3 benzene rings.

18. The method of claim 11, wherein an amount of the alkanolamine is in a range of about 0.01 to 40%, by weight, based on a total amount of the composition.

19. The method of claim 11, wherein a dipole moment of the polar material is at least three (3), and an amount of the polar material is in a range of about 0.01 to 50%, by weight, based on a total amount of the composition.

20. The method of claim 11, wherein the polar material is at least one selected from the group consisting of water, methanol and dimethylsulfoxide.

21. The method of claim 11, wherein metallic layer and photoresist pattern are used for forming an aluminum pad of the semiconductor device.

22. A composition for removing photoresist from an underlying layer, comprising:
ethoxy N-hydroxyethyl propanamide and ethanolamine, the composition removing the photoresist without leaving any thread-shaped residues on the underlying layer wherein the composition is formed by a method comprising: mixing alkyl alkoxy alkanoate and alkanolamine to form a mixture; stirring the mixture; cooling the mixture to form a composition of ethoxy N-hydroxyethyl propanamide and ethanolamine.

23. A method of removing a photoresist pattern from an underlying layer, comprising:
applying a composition on the photoresist pattern and underlying layer to remove the photoresist pattern without leaving any thread-shaped residues on the underlying layer, the composition including an ethoxy N-hydroxyalkyl alkanamide, an alkanolamine and a polar material; and rinsing a surface of the underlying layer to remove any remaining composition.

24. The method of claim 23, wherein a pre-treatment process for removing polymers is not required prior to said applying a composition on the photoresist pattern and underlying layer.

25. The method of claim 23, wherein a damage preventing agent to prevent damage to the underlying layer, exposed after removal of the photoresist pattern, is not applied after said applying but before said rinsing.

26. The method of claim 23, wherein said ethoxy N-hydroxyethyl propanamide is represented by the chemical formula $CH_3CH_2-O-R_3-CO-N-R_1R_2OH$, an alkanolamine and a polar material, and $R_1$ is one of an H atom, a hydrocarbonyl group including 1 to 5 carbons and an aromatic hydrocarbonyl group including 1 to 3 benzene rings, $R_2$ is a hydrocarbon including 1 to 5 carbons or an aromatic hydrocarbon including 1 to 3 benzene rings, and $R_3$ is a hydrocarbon including 1 to 5 carbons.

* * * * *